(12) United States Patent
Choi et al.

(10) Patent No.: US 8,689,687 B2
(45) Date of Patent: Apr. 8, 2014

(54) METHOD AND APPARATUS FOR MANUFACTURING ELECTRONIC DEVICE USING ROLL-TO-ROLL ROTARY PRESSING PROCESS

(75) Inventors: Byung-Oh Choi, Daejeon-si (KR);
Byung-Soon Ryu, Daejeon-si (KR);
Kyu-Jin Lim, Daejeon-si (KR);
Kwang-Young Kim, Gyeongsangnam-do (KR); Dong-Soo Kim, Daejeon-si (KR); So-Nam Yun, Daejeon-si (KR); Young-Bog Ham, Daejeon-si (KR); Taik-Min Lee, Daejeon-si (KR); Jeong-Dai Jo, Daejeon-si (KR); Hyun-Eui Lim, Daejeon-si (KR); Chan-Su Yoo, Daejeon-si (KR)

(73) Assignee: Korea Institute of Machinery & Materials, Daejeon-Si (KR)

( * ) Notice: Subject to any disclaimer, the term of this patent is extended or adjusted under 35 U.S.C. 154(b) by 882 days.

(21) Appl. No.: 12/476,104

(22) Filed: Jun. 1, 2009

(65) Prior Publication Data
US 2009/0288567 A1 Nov. 26, 2009

Related U.S. Application Data

(63) Continuation-in-part of application No. 11/394,086, filed on Mar. 31, 2006, now abandoned.

(30) Foreign Application Priority Data

Apr. 13, 2005 (KR) ........................ 20-2005-0030722

(51) Int. Cl.
B41F 9/01 (2006.01)
(52) U.S. Cl.
USPC ..................... 101/154; 101/181; 101/DIG. 42

(58) Field of Classification Search
None
See application file for complete search history.

(56) References Cited

U.S. PATENT DOCUMENTS 3,960,081 A * 6/1976 Gustavs et al. ............ 101/424.1
4,209,551 A 6/1980 Masaki et al.
(Continued)

FOREIGN PATENT DOCUMENTS

EP 0710060 5/1996
JP 02244785 9/1990

OTHER PUBLICATIONS

Final Office Action issued Feb. 2, 2009, in U.S. Appl. No. 11/394,086.

(Continued)

*Primary Examiner* — Joshua D Zimmerman
(74) *Attorney, Agent, or Firm* — Bryan Cave LLP

(57) ABSTRACT

The present invention discloses an apparatus for manufacturing electronic devices using a roll-to-roll rotary pressing process, comprising a winding roll around which flexible printing paper is wound; a plurality of printing units arranged in a straight line; at least one coating unit; a rewinding roll to rewind the printing paper when printing has been completed; a plurality of guide rolls arranged between the winding roll and the rewinding roll, thus guiding the printing paper; a plurality of drying units, each drying unit being provided on a printing paper-path between the printing unit and the adjacent guide roll to dry ink transferred to the printing paper or on a printing paper-path between the coating unit and the adjacent guide roll to dry the printing paper on which coating agent is supplied; and tension regulating units installed around the winding roll and the rewinding roll, respectively, for regulating tension of the printing paper.

9 Claims, 9 Drawing Sheets

(56) References Cited

U.S. PATENT DOCUMENTS

| | | |
|---|---|---|
| 4,898,752 A | 2/1990 | Cavagna et al. |
| 6,070,528 A | 6/2000 | Fleischmann et al. |
| 6,311,619 B1 | 11/2001 | Stamme et al. |
| 6,386,771 B2 | 5/2002 | Haller |
| 2002/0014169 A1 | 2/2002 | Siler et al. |
| 2003/0130432 A1 | 7/2003 | Araki et al. |
| 2003/0164102 A1 | 9/2003 | Schaede |
| 2005/0076800 A1 | 4/2005 | Faist et al. |

OTHER PUBLICATIONS

Office Action issued Jul. 3, 2008, in U.S. Appl. No. 11/394,086.
"Silicone Rubber", Printed Jun. 20, 2008, Wikipedia, p. 2.

* cited by examiner

METHOD AND APPARATUS FOR MANUFACTURING ELECTRONIC DEVICE USING ROLL-TO-ROLL ROTARY PRESSING PROCESS

CROSS-REFERENCE TO RELATED APPLICATIONS

This application claims priority to KR 2005-0030722 filed on Apr. 13, 2005. This application claims also benefit of and is a continuation-in-part of U.S. application Ser. No. 11/394,086 filed on Mar. 31, 2006. These references are incorporated by reference in their entirety for all purpose.

BACKGROUND OF THE INVENTION

1. Field of the Invention

The present invention relates to a method and an apparatus for manufacturing an electronic device using a roll-to-roll rotary pressing process, which is intended to economically manufacture an electronic circuit device, such as an IC chip, using functional ink and a roll-to-roll rotary pressing process.

2. Description of the Related Art

As well known to those skilled in the art, electronic devices, such as transistors or ICs, form a circuit pattern using a compact crystal structure of an inorganic material, such as metal or silicone. Thus, an important deposition process, such as a sputtering process, is performed under high temperature and vacuum conditions, using expensive precision equipment. Most manufacturing and inspecting operations require a very clean environment. Further, the operations are performed not through a constant continuous production method but through a batch production method having several stages, so that productivity is very low. According to Moore's law regarding technical development speed, which states that the capacity of memory chips to be developed in the future will double every 18 to 24 months, a nano-scale pattern will be developed. In this case, manufacturing costs will further increase. Thereby, the amount to be invested for new installations may reach several trillions of won. Moreover, whenever a pattern forming process using photolithography and an etching process are repeated, many chemical cleaning operations must be carried out, thus incurring a heavy burden for waste-water treatment and pollution prevention.

In spite of high manufacturing costs, silicone semiconductor producing technology must be further developed in order to produce a high density product of a giga or tera grade, because high density products continuously generate good profits. Meanwhile, the production of an IC chip which has a low grade, that is, a kilo-grade, has low economic efficiency. Thus, even if the kilo-grade chip is required, it will not be produced. Even though the silicone semiconductor industry is developing towards nanotechnology, an industry providing cheap middle or low grade microchips must be maintained in order to provide cheap electronic products for general purposes. To this end, an alternative industry is keenly needed.

When new-generation RFID/USN electronic devices, which are most electronic devices for general purposes, are manufactured using current silicone semiconductor technology, manufacturing costs are high. Thus, it is impossible to supply the electronic devices at low cost. Conversely, if an electronic device comprising a printed IC chip is produced at low cost through a printing method, such as commonly used printed material, the electronic device may be supplied at low cost. Current printing technology is highly developed with respect to productivity and quality. Thus, when rotary pressing technology having high productivity is applied to produce a printed IC chip, an RFID tag can be manufactured for one cent or less, so that a price target is easily achieved.

In order to produce an electronic device having micro scale lines through printing, unlike a silicone semiconductor, no matter how simple the function of the printed IC chip is, the material of circuit elements, including a conductor, a semiconductor, and a dielectric, must have properties in order to be sufficiently printable. Since many efforts have been made to develop nano particles of conductive polymers for several decades, various kinds of printing ink (functional ink) have been developed. Hence, recently, there are many attempts to develop a thin film transistor, a solar battery, a light emitting diode, an integrated circuit, etc. through a printing method using the printing ink. However, the production of the IC chip is not easily realized through the printing method using various kinds of functional ink. It is still in an experimental stage, because of complicating factors.

First, the IC chip cannot be produced through printing because of an ink material. Inventive ink material is still in an initial development stage with respect to characteristics, durability, and cost, so that it is unfeasible to use the ink material in practice. That is, the quality of the ink material and production technology therefore are insufficient, so that the ink material cannot be mass-produced. Although the technology for the ink material is advanced and the costs of the material have become low, electronic devices, such as various IC chips, must be produced through a new method using a printing process, and a booming market where products are competitively supplied and demanded must be created so as to rapidly develop the IC chip printing process. Further, if a printer, which is the important element for producing a printed IC chip, is not modified to be suitable for manufacturing IC chips but is a general printer for printing graphics or images, it is impossible to develop or produce a micro printed IC chip as desired.

Among general printers, a representative printer used in the electronic industry is a screen printer. Assuming that an image screen having visual information or the pattern of an electronic circuit have similar resolution of about 200 μm, even a general screen printer may be used as excellent equipment for manufacturing electronic devices. However, if a print having a finer pattern is required, it is impossible to manufacture a desired electronic device using the general screen printer. Thus, recently, the screen printer has been developed into a precision screen printer, thus increasing the resolution and improving a registration function. Thereby, the precision screen printer is useful for forming a pattern having a larger area in a process for manufacturing a PDP or the like. As advanced screen printing technology, another printing method has been proposed, which is called stencil printing. The stencil printing originates from the screen printing method, but uses a thin metal plate in place of a screen plate. The stencil printing method plays an important role as equipment for mounting semiconductor chips. It is a good example of development of the general printer into equipment for producing an electronic device. However, the resolution of the equipment has not reached the resolution required for manufacturing IC chips.

Further, many attempts have been made in a silicone semiconductor industrial field to produce electronic devices using not a stage production process but a roll-to-roll continuous production process. No matter how the precision screen printer or the stencil printer is developed to be generally used for producing electronic devices, it does not overcome the limitation of the stage production process. A roll-to-roll continuous printing process has been already developed. However, unless a new rotary pressing technology and a new ink transfer method for a printed IC chip, which must be fundamentally superior to existing image information printing technology and printers optimized for a person's visual discrimination, are developed, a conventional rotary press cannot be utilized. Thus, like the precision screen printer or the stencil printer, the printing method using the rotary press must be modified so as to be suitable for producing electronic devices.

Recently, an ink jet printing method has been used to provide MEMS characteristics to an electronic device. The ink jet printing method is one kind of direct-imaging printing method, and is carried out in a non-contact manner as follows. That is, ink droplets having a very small size in the pico-liter scale are deposited through a nozzle of an ink jet head on an object to be printed according to a design pattern stored in a computer file at a high discharge speed which discharges several thousands droplets per second. Such a printing method has been rapidly developed for several decades, and is becoming a representative digital printing method which is used in a print field outputting digital file data. In order to perform even a printing test of a conventional printer, a person must master a complicated plate-making operation and a difficult multi-stage control operation for driving the printer. Unlike the conventional printer, a material scientist can easily use the ink jet printer. That is, it is possible to immediately obtain a printed product through the ink jet printing which is automatically driven according to the pattern data stored in a computer, so that such a printing method is the most preferred printing method in the organic semiconductor technology field. However, the ink jet printing method basically uses dot printing technology, unlike other printing methods. Thus, several problems may occur in the application of the ink jet printing method to line pattern printing.

In a detailed description, the ink jet printing method is disadvantageous compared to a typical printing method which is performed in a contact manner using a printing plate, in consideration of a pin hole forming a line using dots, gaps, surface roughness, edge roughness, difficulty in forming lines of various widths, and positional misalignment when repeatedly printing. Further, in the case where mass production is attempted, the movement of many nozzles when a plurality of engine sets comprising a great number of ink jet heads is moved is complicated in comparison with a very simple printing using a printing plate. Hence, it is difficult to obtain uniform print quality, especially when micro printing. As a result, a lot of research has been conducted and a lot of effort has made in order to develop an ink jet printing method that can overcome the above-mentioned problems when printing an organic IC chip.

Recently, as another example, soft lithography, also known as micro contact printing, has been promoted. Soft lithography was invented so as to produce an IC chip circuit having a design rule from 100 to 0.1 μm in an economical manner. The soft lithography is a new printing method which performs line pattern printing using a simple contact-type printing process. However, this method is used as a process replacing only a photolithography process in a silicone semiconductor production process, unlike the original intention. Since the printing method conducts printing using special precision chemical ink which may form a self-assembled monolayer (SAM), the printing of a fine line width at a nano grade as well as a micro grade is possible. A printing plate uses a flexography printing plate manufactured by preparing a concave mold pattern having a fine pattern using a photolithography technique of the existing silicone semiconductor manufacturing process, and pouring silicone rubber into the concave mold pattern. However, the technology making a silicone rubber printing plate having a fine pattern corresponding to a sub micro grade using advanced silicone semiconductor technology, and realizing the pattern of a fine corrosion-preventing film using SAM ink, which is an expensive high-grade material, is used only for producing expensive IC chips. Thereby, this printing method tends to be used for nano-transfer-printing (NTP) technology, unlike its original purpose. This printing method has been developed as technology having higher economical efficiency and productivity in a corrosion-preventing film manufacturing process for a large-sized IC circuit and a nano-grade IC chip, which has not satisfactorily been achieved by current photolithography technology. Therefore, the soft lithography printing method is not printing technology suitable for efficiently producing a printed IC chip that is inexpensive and has a simple function.

Further, a printing method using a precision screen printer provides relatively good results in comparison with the photolithography method, when a plate panel display, such as a PDP or an LCD, which is wide and has a larger area, is manufactured, so that the printing method contributes to this field. The printing method contributing to the field includes a screen printing method, an ink jet printing method, a gravure offset printing method, etc. The gravure offset printing method provides excellent ink transferability when a fragile substrate, such as glass, is printed. Further, since it is possible to use a finely patterned gravure printing plate, the gravure offset printing method is used to manufacture an IC circuit plate having a larger area and serving as an active component for driving the display. Further, the printing method is used to form a color filter element of a display having a large area.

The gravure offset printing method is called a rotary pad printing method. The gravure offset printing method is used in the above-mentioned field, because it is possible to make a fine circuit line pattern having a design rule of several micrometers on a cylindrical printing plate, it is possible to use an elastic blanket made of silicone rubber, which easily transfers ink to a fragile substrate having a large area, like screen printing and ink-jet printing, and 100% ink transferability of the silicone rubber is suitable for electronic pattern printing. However, this is mainly used to overcome an upper area limit in a photoresist patterning process, which is one silicone conductor process. Meanwhile, recently, many attempts have been made to put into practice methods derived from the gravure offset printing method, which is advantageously used to print a fine electrode circuit thanks to the development of conductive polymer ink. However, it may only substitute for photoresist patterning in the silicone semiconductor process, and is only useful as a batch printing method for a substrate having a larger area. Thus, no printing method which supplements the function of the gravure offset printing method has been proposed for making a printing unit, which could thereby economically produce an IC chip in a rotary pressing process, like the present invention.

An advanced printing technology is a newspaper printer. Recently, the rotary offset printing technology for newspaper printing has been developed to the extent that the production speed has reached a current maximum of 25 m/sec (1500 m per minute). To this end, the driving method has recently changed. That is, according to the prior art, a shaft and gears are complicatedly mechanically coupled to one main motor, thus rotating many cylinders of respective units. This has changed to a shaftless system, in which each cylinder is independently rotated by a respective servo motor. A servo driver for the servo motors is controlled via a computer, so that multicolored printing and a post process, such as folding or cutting operation, can be more accurately and consistently achieved at high speed using one printer.

Further, the ink supply amount is automatically controlled by vision control employing a digital camera, and the drive cylinder of each printing unit is delicately controlled with respect to the rotating direction and the axial direction for the purpose of precise registration. As such, mechatronics and automatic control operation have been developed into a system comprising a high technology computer, so that automation having a self-diagnostic function has been achieved. This is the first roll-to-roll production equipment. However, the current rotary press for printing newspaper cannot be used to print an IC chip. The reasons are as follows.

First, the resolution for informational image printing, including newspaper printing, is adapted to a person's visual limits. Thus, it is designed such that the highest resolution is about 100 µm (250 lpi). However, for a transistor, which is an important active component of an IC chip, an organic thin film transistor (OTFT), which may be printed using organic ink, such as conductive polymer or semiconductor polymer, must have a channel length between a source and a drain or a circuit line width of about 10 µm, so as to increase the usability thereof. Thus, the printing resolution realized by the printing technology must be developed to about 10 µm. However, since the current printing technology is set to 100 µm, the technology cannot be applied to print and produce an IC chip requiring a design rule of 10 µm.

Second, regardless of whether the offset printing technology, the gravure printing technology, the type printing technology, or another highly productive printing technology is considered, the image printing technology for visual information has been developed based on dot printing technology. In order to apply the general printing technology to IC chip printing requiring line patterns, many problems of the ink jet printing method must be solved. Thus, new printing technology must be developed to realize line-pattern printing.

Third, general printing, such as color printing, is technology that conducts printing using a distributional arrangement process such that respective dots having different colors printed by one color in different two-dimensional printing units do not overlap each other, if possible. However, in order to produce an IC chip using a contact-type printing process using a printing plate, a technique permitting overlap printing is required in order to realize a three-dimensional MEMS technique. The visible image information printing can utilize a screen distribution technique comprising several dots that use an optical illusion to deceive a person's eyes. Thus, even if the dots are not contiguous, this is allowable to some extent. Further, when one dot overlaps another dot which has been previously printed and is not dry and the resultant color is muddy, this is no problem so long as the muddiness is not detected by a person's eyes. However, the line pattern of the printed IC chip does not tolerate the above-mentioned printing defects, but strictly requires the printing of a pattern and shape having reliable physical parameters. A new print quality standard must be established. That is, printing which produces a line-gain beyond an allowable tolerance, in addition to having the problems of pin holes, discontinuities, roughness, etc., is unacceptable. Further, printing layers printed one by one must be neatly transferred, the physical properties of overlapping printing layers must not be mixed with each other, and insufficient drying, leading to intermixing, is unacceptable.

Fourth, as described above, the print quality of image information is finally determined by a person's eyes, so that it is possible to visually check colors, resolution, or concentration using an optical camera. Since it is possible to measure the colors, resolution, or concentration by sensing light reflected from printed matter, production and real-time inspection may be simultaneously carried out in a printing line merely by mounting a camera on the printer. However, the quality of an electronic device is determined by electronic physical factors, including conductivity, mobility, a dielectric constant, etc., which are measured by direct contact using a probe of an electrode.

When an IC chip is produced through a roll-to-roll rotary pressing process, desired productivity and economical efficiency cannot be achieved unless real-time inspection is conducted through a non-contact type of in-line inspection method, as in general printing. In the present state, the inspection method of the general printing, which measures color, resolution, and concentration, must be indirectly used. The optical parameters of physical factors are appropriately determined according to the ink and print conditions, so that the visual method using a camera is employed.

Fifth, a more precise registration capability is required, in comparison to the conventional rotary pressing technology that prints an object to be printed, which is susceptible to tension, heat, and moisture, like paper and film, using a roll-to-roll process. A precise register control is required to form a fine pattern circuit of the printed IC chip at a predetermined position for respective layers through printing. In other words, a register control which controls an allowable tolerance in a more precise and highly advanced pattern having a resolution of about 10 µm is required.

SUMMARY OF THE INVENTION

Accordingly, the present invention is conceived to solve the above problems occurring in the prior art, and an object of the present invention is to provide an apparatus for manufacturing electronic devices using a roll-to-roll rotary pressing process, comprising a winding roll around which flexible printing paper is wound; a plurality of printing units arranged in a straight line; at least one coating unit; a rewinding roll to rewind the printing paper when printing has been completed; a plurality of guide rolls arranged between the winding roll and the rewinding roll, thus guiding the printing paper; a plurality of drying units, each drying unit being provided on a printing paper-path between the printing unit and the adjacent guide roll to dry ink transferred to the printing paper or on a printing paper-path between the coating unit and the adjacent guide roll to dry the printing paper on which coating agent is supplied; and tension regulating units installed around the winding roll and the rewinding roll, respectively, for regulating tension of the printing paper.

Here, the coating unit comprises a coating-agent container to contain a coating agent therein; a coating-agent feeding roll installed to be immersed in the coating agent; a coating roll installed to contact the coating-agent feeding roll, rotating in one direction, and coating the surface of the printing paper having the circuit pattern with the coating agent; a coating press roll installed to contact the coating roll, thus pressing the printing paper.

In addition, the printing unit comprises an ink reservoir storing functional ink therein; an ink injection roll installed to be immersed in the functional ink; a forming roll installed to be rotated in one direction while contacting the ink injection roll, with forming grooves provided on the surface of the forming roll to correspond to the shape of a desired circuit pattern; a doctor blade installed to contact a side of the forming roll, and scraping ink from a surface of the forming roll; a first drying device to dry a surface of the functional ink injected into each of the forming grooves; a printing roll installed to be rotated in a direction opposite that of the forming roll while contacting the forming roll, and transferring forming ink transferred from the forming roll to the printing paper; a second drying device to dry another surface of the forming ink transferred to a surface of the printing roll; and a press roll installed to be rotated in a direction opposite that of the printing roll while contacting the printing roll, and pressing the printing paper toward the printing roll at a constant pressure.

In particular, each printing unit of the manufacturing apparatus of the present invention may comprises a first pressure regulator coupled to the forming roll for regulating a contact pressure between the forming roll and the printing roll, and a second pressure regulator coupled to the press roll for regulating a contact pressure between the press roll and the printing roll.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, the preferred embodiment of the present invention will be described in detail with reference to the accompanying drawings.

Summarizing the invention, this invention relates to a method of mass producing an electronic device, such as a thin film transistor or an IC chip, by directly printing a circuit pattern using a printer, functional ink, such as a conductive polymer, and a roll-to-roll printing process.

Particularly, typical rotary pressing technology is adopted, which easily conducts transferring and printing by adhering ink to a forming roll, which is made in the method having the highest productivity among conventional image information printing methods so as to conduct manufacturing using a continuous method, that is, a roll-to-roll method. However, in order to print a pattern of an electronic circuit comprising lines, unlike a general printing technique expressing a pixel using dots, a gravure plate making method, which is advantageous for printing using lines, is modified and adapted to this invention. Thus, an ink transfer method is developed, which is an indirect printing method using a printing roll to repeatedly print line patterns of an IC chip and thus efficiently construct a micro electro mechanical system (MEMS). Further, in-line testing and real-time print setting correction are performed in a non-contact manner using an optical camera. A continuous total inspection and a real-time automatic control operation are developed to be suitable for the intended purpose. The current production speed is still lower than that of a general rotary press, but affords accurate register setting. This will be further improved in the future.

Figure 1:
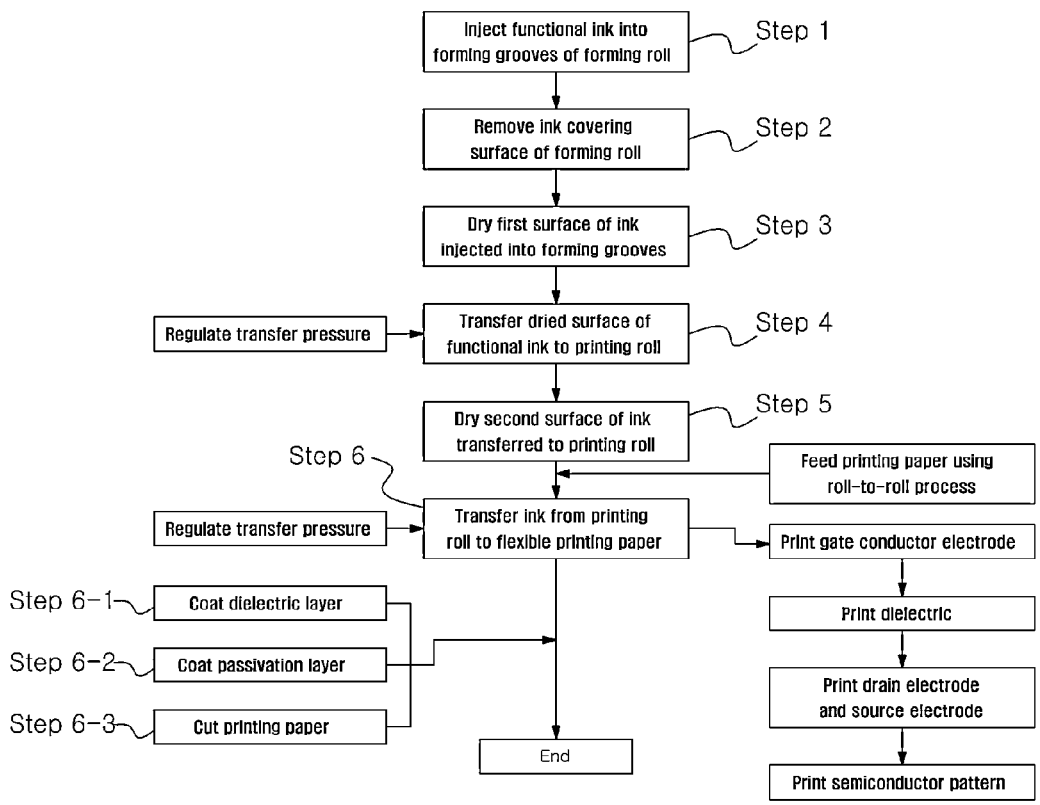
FIG. 1 is a flowchart illustrating a method of manufacturing an electronic device, according to the present invention.
Figure 2:
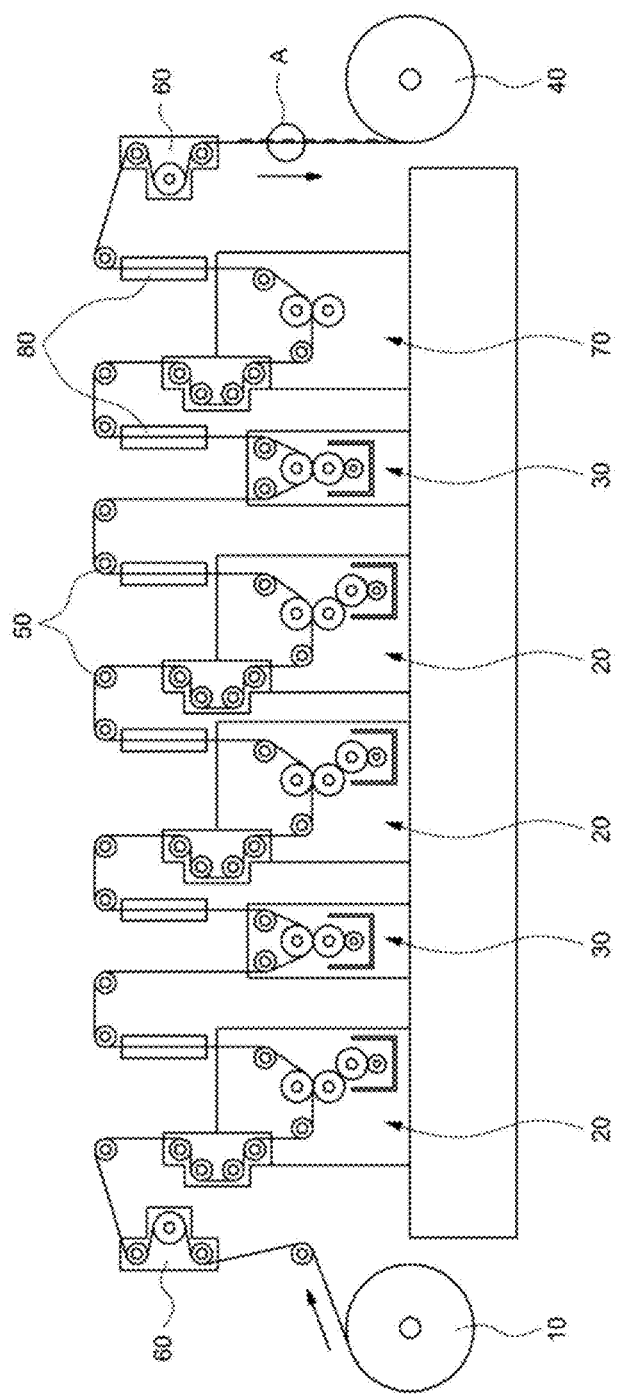
FIG. 2 is a view showing the entire construction of an apparatus for manufacturing an electronic device, according to the present invention.
Figure 3:
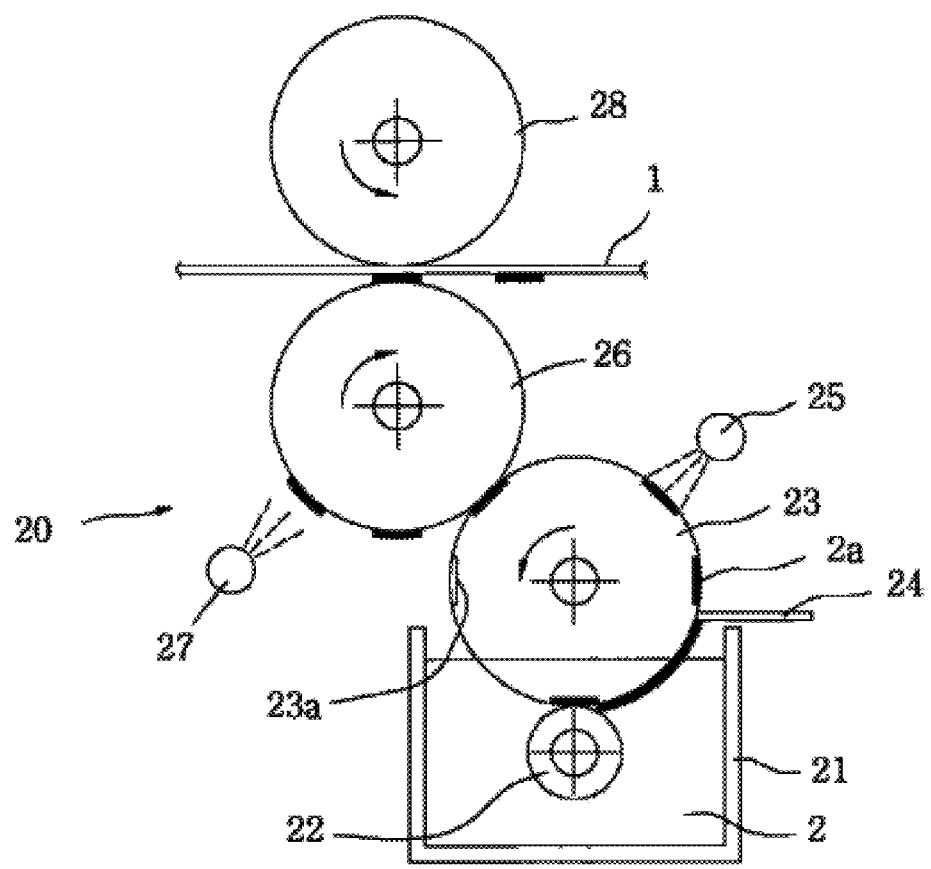
FIG. 3 is a detailed view showing part of the electronic device manufacturing apparatus, that is, a printing unit, according to the present invention.
Figure 4A:
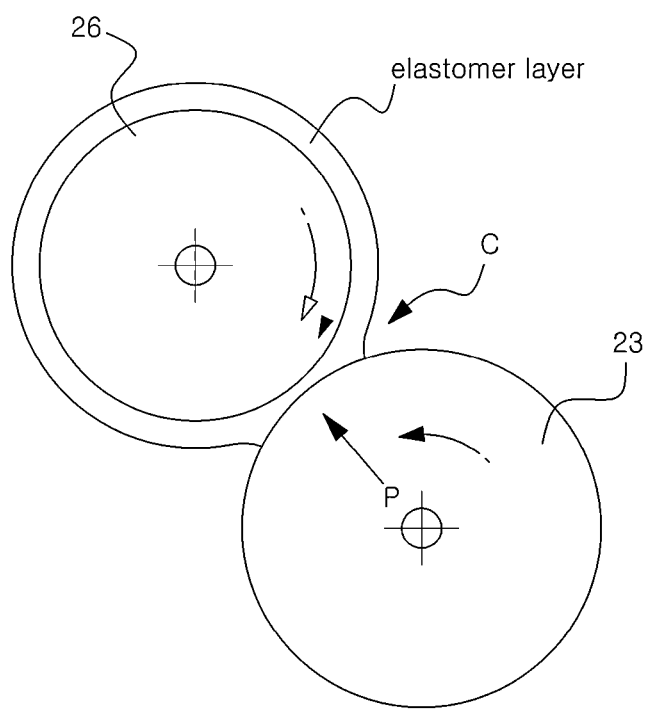
FIG. 4a is a view illustrating a relation between a printing roll and a forming roll in a printing unit.
Figure 4B:
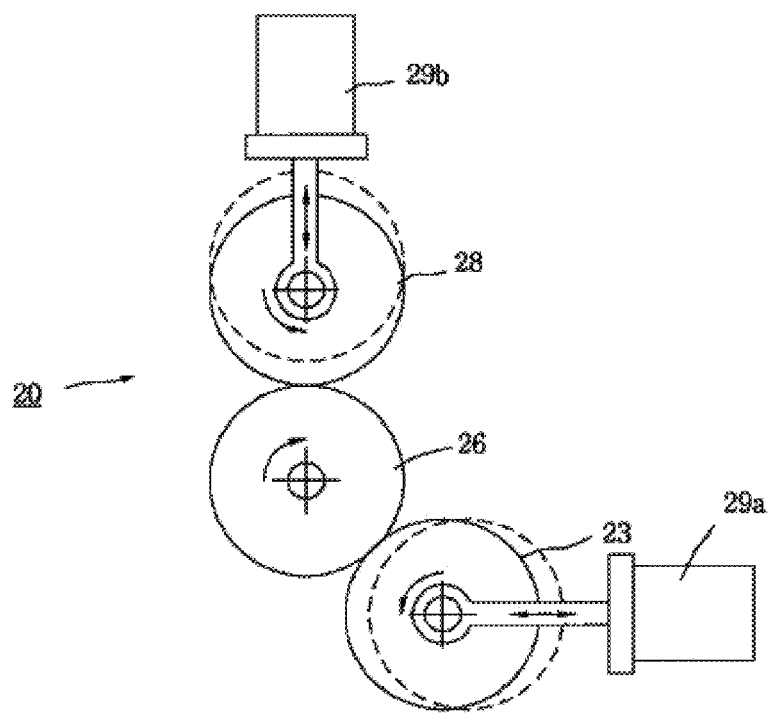
FIG. 4b is a view illustrating pressure regulators installed in a printing unit and a process for regulating a contact pressure between a printing roll and a forming roll.
Figure 4C:
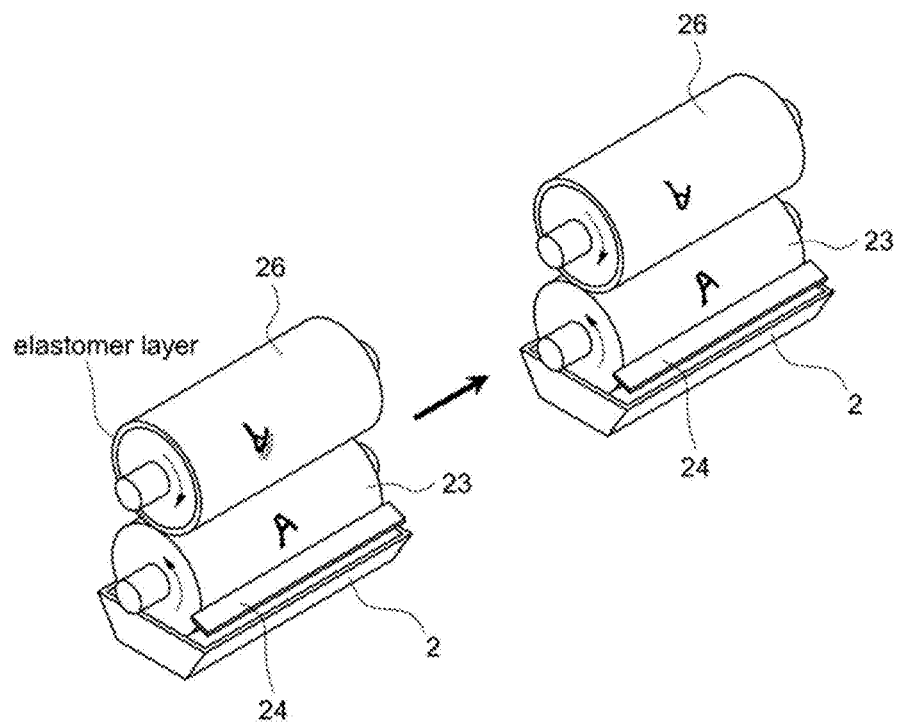
FIG. 4c is a view illustrating ink transferring conditions after and before operation of a pressure regulator.
Figure 5:
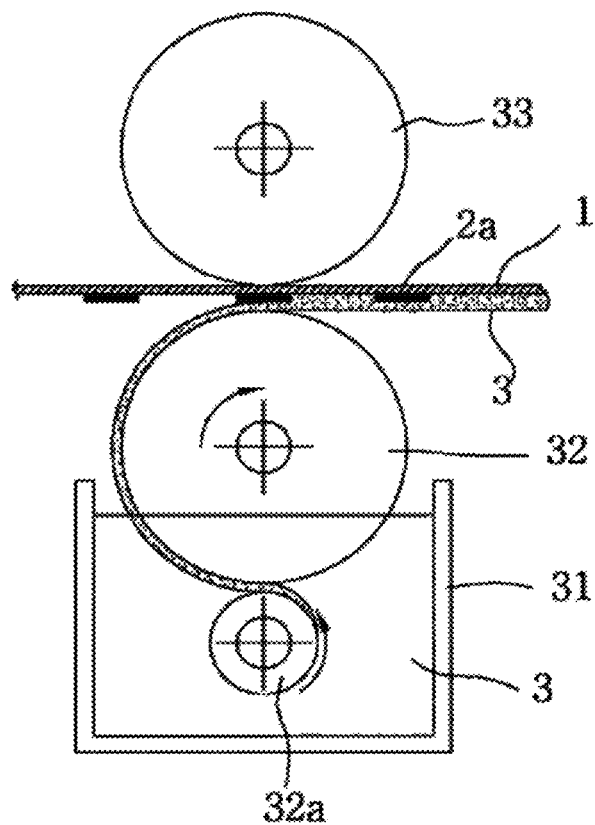
FIG. 5 is a detailed view showing part of the electronic device manufacturing apparatus, that is, a coating unit, according to the present invention.
Figure 6A:
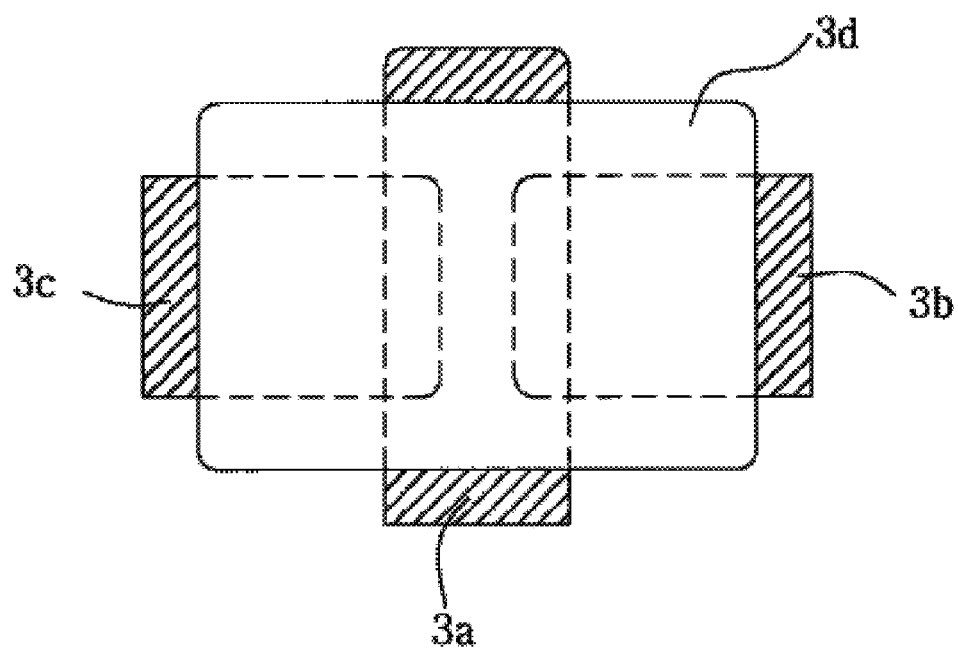
FIGS. 6a to 6c are sectional views of the portion "A" of FIG. 2 showing that an electronic device is printed on a printing paper.
Figure 6B:
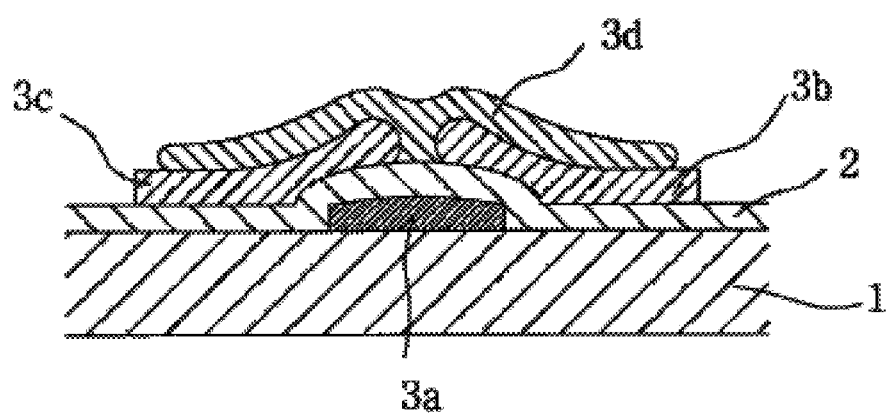
Figure 6C:
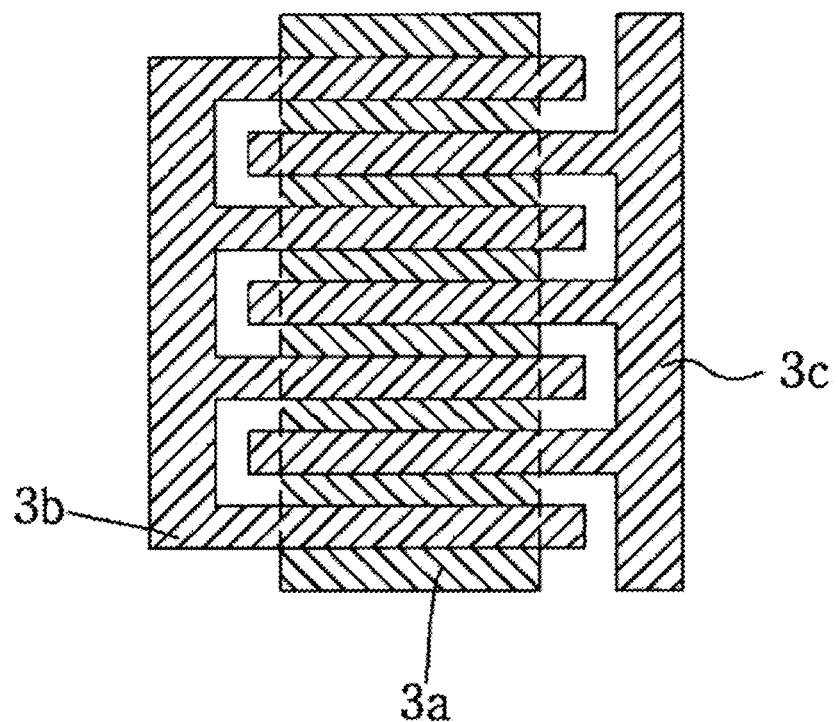

FIG. 1 is a flowchart illustrating a method of manufacturing an electronic device, according to the present invention, FIG. 2 is a view showing the entire construction of an apparatus for manufacturing an electronic device, according to the present invention, FIG. 3 is a detailed view showing part of the electronic device manufacturing apparatus, that is, a printing unit, according to the present invention, FIG. 4a is a view illustrating a relation between a printing roll and a forming roll in a printing unit, FIG. 4b is a view illustrating pressure regulators installed in a printing unit and a process for regulating a contact pressure between a printing roll and a forming roll, FIG. 4c is a view illustrating ink transferring conditions after and before operation of a pressure regulator, FIG. 5 is a detailed view showing part of the electronic device manufacturing apparatus, that is, a coating unit, according to the present invention, and FIGS. 6a to 6c are sectional views of the portion "A" of FIG. 2 showing that an electronic device is printed on printing paper.

The gravure offset printing method of manufacturing an electronic device using the apparatus according to the present invention will be described in detail with reference to the accompanying drawings.

(Step 1) Functional ink is injected into forming grooves of a forming roll.

In each printing unit 20, an ink injection roll 22 immersed in ink 2 stored in an ink reservoir 21 is installed to be in close contact with a forming roll 23 which is provided above the ink injection roll 22. While the forming roll 23 and the ink injection roll 22 rotate, ink covering the ink injection roll 22 is injected into forming grooves 23a which are provided on the surface of the forming roll 23.

(Step 2) The ink covering the surface of the forming roll is scraped off.

At step 2, a doctor blade 24, which is called a scraper, is installed to be in contact with the surface of the forming roll 23. Thus, when the forming roll 23 is rotated, the doctor blade 24 scrapes the surface of the forming roll 23, thus eliminating the ink covering the surface of the forming roll 23. However, ink filling the forming grooves 23a is not eliminated by the doctor blade 24, so that the ink remains in the forming grooves 23a.

(Step 3) A surface of the functional ink filling each forming groove is dried.

At step 3, a first drying device 25 is installed to blow hot air or radiate IR or UV light beams, thus hardening (drying) a surface of the ink, just before the forming roll 23 comes into contact with the printing roll 26. Thus, the cohesion of the ink filled in each forming groove 23a is increased, so that the ink can be easily transferred to the surface of the printing roll 26.

(Step 4) The dried surface of the functional ink is transferred to the printing roll.

At step 4, forming ink 2a filling the forming grooves 23a of the forming roll 23 is transferred to the surface of the printing roll 26. Such a transfer process has excellent transferring efficiency, because a surface of the ink, that is, surface transferred to the printing roll 26, is dried to afford good transfer, in the previous step 3.

(Step 5) The other surface of the functional ink transferred to the printing roll is dried.

At step 5, a second drying device 27 is installed to blow hot air or radiate IR or UV light beams, thus hardening (drying) the other surface of the ink, just before the printing roll 26 comes into contact with printing paper 1. Thus, the cohesion of the forming ink 2a transferred to the printing roll 26 is increased, so that the ink is easily transferred from the printing roll 26 to the surface of the printing paper 1.

(Step 6) The functional ink in the printing roll is transferred to flexible printing paper which is unwound from a winding roll.

At step 6, the forming ink 2a attached to the surface of the printing roll 26 is transferred to a surface of the printing paper 1. In the state where the printing paper 1 passes through the printing roll 26 and a press roll 28, ink is transferred to the surface of the printing paper 1 contacting the printing roll 26, and the press roll 28 presses the printing paper 1 against the printing roll 26. As a result, ink is transferred and printed on the printing paper 1.

In addition to the above-mentioned steps, a step 6-1 of coating a dielectric layer may be performed after the step 6. Further, a step 6-2 of coating another functional layer (for example, passivation layer) may be performed after the step 6. Furthermore, a step 6-3 of cutting the printing paper 1 when the printing operations have been completed may be performed.

The dielectric-layer coating step 6-1 is a step in which a dielectric is applied between a lower ink layer and an upper ink layer when ink is applied in layers. The passivation-layer coating step 6-2 is a step in which a passivation layer is applied on the surface of the uppermost ink layer, thus protecting the ink layers.

Further, the cutting step 6-3 is a step in which cutting is completely or incompletely conducted between repeatedly printed patterns, thus allowing the printed electronic devices to be easily separated from each other in a subsequent process.

In the meantime, the above steps 1 to 6 are repeatedly performed in all the printing units (20 in FIG. 2) and the steps 6-1, 6-2 and 6-3 may be performed in a coating unit 30 adjacent to the printing unit 20.

Finally, the printing paper 1 on which the electronic circuit pattern is printed through the ink transferring operations in all the printing units 20 is wound around the rewinding roll 40.

Hereinafter, the manufacturing method will be described further.

The gravure plate-making method of the forming roll used in the present invention may use a screening technique for dot printing or not. The gravure plate-making method for general printing comprises image printing using dot pixels. Thus, if the forming grooves 23a are formed using the screening process, a proper amount of ink is transferred, so that ink, having low viscosity, does not flow out. However, a gravure plate of the circuit pattern comprising lines has fine micro-grade lines. Thus, once ink fills the forming grooves 23a, the ink seldom flows out. Accordingly, the screening operation can be omitted. If possible, the plate is made such that the forming grooves are deep. In this way, it is necessary to increase the initial ink transfer amount. Ink having low viscosity of several centipoises has a relatively large solvent content. Thus, the content of a functional material whose thickness is reduced after a drying process can be controlled within an error range. It is possible to realize a width and interval of fine lines of about 10 μm, through a gravure plate making method using a laser.

In order to neatly transfer and print ink for MEMS on the printing paper (paper or plastic film), the destructivity of typical ink transfer, where an ink layer having a liquid property is transferred by an adhering and tearing operation between the forming roll 23 and the printing roll 26 must be overcome, unlike the general printing. In order to transfer the ink having the shape of the forming grooves 23a without a large changing the original shape, in the manner where surfaces of the two rolls contact each other, ink compactly fills the fine forming grooves 23a. To this end, it is necessary to change the fluid state of the ink to an immobile state thereof. If the ink is changed to a solid state, the printing itself becomes impossible. Thus, the viscoelasticity of the ink must be increased to a degree that maintains predetermined liquidity, so that the shape of the ink escaping from the forming grooves 23a is not destroyed. Since the viscoelasticity of the ink is increased but the ink has fluid characteristics, an excessively low contact transfer pressure does not sufficiently transfer the ink in the forming grooves 23a, and an excessively high pressure destroys the shape of the ink layers. Therefore, as shown in FIG. 1, in order to provide proper impression pressure, a gravure offset printing method is used, which adopts an indirect printing method using the printing roll 26 made of rubber elastomer, that is, silicone rubber, as an intermediate transfer medium. As described later, preferably, the printing roll 26 may have an elastomer layer formed on an outer circumference thereof.

This method is analogous to a rotary pad printing method. However, the method further develops the general rotary pad printing method to control the transfer pressure acting on ink fluid. Further, in order to improve the adhesive transferability of the ink layers and neatly transfer a pattern without change, it is constructed to maintain the pressure level and the drying condition constant.

In order to transfer half or more of the ink in the forming grooves 23a to the printing roll, the exposed surface of the ink contained in the forming grooves of the forming roll 23 is momentarily volatilized. As a result, the surface is hardened to some extent so that the adhering force, taking viscoelasticity into account, is higher than that of the ink in the forming grooves. Therefore, when the printing roll 26 is in sufficiently close contact with the ink surface, the ink layers can be easily adhered to the lengthened surface of the printing roll. To this end, it is necessary for the printing roll 26 to have elasticity, that is, low hardness, unlike the hardness of a printing roll used in general offset printing.

In this way, the printing ink transferred to the surface of the printing roll has a secondary transferring process comprising transfer to printing paper (substrate) contacting the press roll 28. When ink is transferred to the printing roll 26, the surface of the inner ink layer in each forming groove 23a may be exposed. At this time, in order to permit nondestructive and easy adhesion and transfer to the printing paper 1, it is necessary to secondarily momentarily volatilize the ink surface on the printing roll 26. As such, due to the momentary volatilization and drying operation during the first and second ink transferring processes, the ink is already dried considerably and is thus hardened to some extent. Thus, the impression pressure for the secondary transfer using the press roll 28 may be set to be higher than the pressure at which the ink is transferred to the printing roll 26.

Further, the solvent is reduced to some extent, so that the problem of bleeding on printing paper 1, such as typical paper, may be reduced, and the spread of ink on non-absorbent printing paper, such as plastic film, due to impression pressure may be reduced. In this case, 100% of the ink transferred to the printing roll 26 is transferred to the printing paper due to the surface characteristics of the printing roll having low surface energy. At this time, the transfer pressure is maintained as low as possible, thus preventing the line width from being increased.

An instantaneous drying device for drying the surface of the forming roll 23 comprises a hot air supply unit or a hardening unit, such as IR or UV, which performs a drying operation after doctoring (or scraping) and before transfer to the printing roll 26. An instantaneous drying device for drying the surface of the printing roll 26 comprises a hot air dryer or a light hardening unit, which is operated after the ink has been transferred from the forming roll 23 and before the ink is transferred to the printing paper 1. In this case, the temperature and air volume in the case of hot air drying, or the intensity or time in the case of light hardening, are individually controlled to be suitable for printing and ink conditions.

The surface hardness of the printing roll 26 may be selected from within a large range from 20 to 70 HS depending on the printing conditions. In particular, in order to efficiently adhere to the ink surface having a fine line pattern, the printing roll 26 must be manufactured to be as flat as possible. In order to efficiently charge the ink in the forming grooves 23a of the forming roll 23, the ink comprises a fluid having a low viscosity of several centipoises. The surplus ink which is not filled in the forming grooves 23a is scraped off by the doctor blade 24, and then the ink is transferred to the printing roll 26. Afterwards, ink remaining in the forming grooves 23a is washed off in the ink reservoir 21 which supplies ink through immersion. In order to supply ink again, the ink injection roll 22 is installed.

Meanwhile, the electronic device (especially transistor) 3 printed and manufactured in the above-mentioned manner will be described in detail with reference to FIGS. 6a to 6c. When a gate conductor electrode 3a is printed on the printing paper 1, the dielectric 4 is superposed on the printing paper to be applied throughout the printing paper. Next, after a drain electrode 3b and a source electrode 3c are printed, a semiconductor pattern 3d is printed. Thus, basic printing of the transistor is completed. The circuit of an organic IC chip to which a plurality of transistors and capacitors are connected becomes considerably complicated. However, the circuit may be manufactured in steps of electrode pattern printing—dielectric application—electrode pattern printing—semiconductor pattern printing. Finally, the passivation layer is applied, or printing, application, laminating, bias, or separation processes are additionally performed on the printer, thus providing a more ideal electronic device.

Hereinafter, the electronic device manufacturing apparatus according to the present invention will be described.

According to this invention, the electronic device manufacturing apparatus includes a winding roll 10, a plurality of printing units 20 having an in-line arrangement, a plurality of coating units 30 or a single coating unit 30, a rewinding roll 40, a plurality of guide rolls 50, and tension regulating units 60.

Flexible printing paper 1 is wound around the winding roll 10. Each printing unit 20 includes an ink reservoir 21 storing functional ink 2 therein, the ink injection roll 22 installed to be immersed in the functional ink, the forming roll 23, the doctor blade 24, the first drying device 25, the printing roll 26, the second drying device 27, and the press roll 28. The forming roll 23 is installed to be rotated in one direction while contacting the ink injection roll 22, and forming grooves 23a corresponding to the shape of a desired circuit pattern are provided on the forming roll 23. The doctor blade 24 is installed to contact one surface of the forming roll, thus scraping ink off the surface of the forming roll. The first drying device 25 dries one surface of functional ink injected into the forming grooves.

The printing roll 26 is installed to be rotated in one direction while contacting the forming roll, and transfers forming ink 2a transferred from the forming roll to the printing paper. The second drying device 27 dries the other surface of the forming ink transferred to the surface of the printing roll. The press roll 28 rotates in one direction while contacting the printing roll 26, and presses the printing paper 1 toward the printing roll 26 with constant pressure.

Meanwhile, each coating unit 30 includes a coating-agent container 31, a coating-agent feeding roll 32a, a coating roll 32 and a coating press roll 33. The coating-agent container 31 contains a coating agent 3 therein. The coating-agent feeding roll 32a is installed to be immersed in the coating agent. The coating roll 32 is installed to be rotated in one direction while contacting the coating-agent feeding roll 32a, and applies the coating agent to the surface of the printing paper having the circuit pattern.

The coating press roll 33 is installed to be contacted with the coating roll, and presses the printing paper 1. The rewinding roll 40 rewinds the printing paper when printing has been completed. The guide rolls 50 are arranged between the winding roll 10 and the rewinding roll 40 to guide the printing paper. The tension regulating units 60 are installed around the winding roll and the rewinding roll, respectively, thus regulating tension acting on the printing paper.

In this case, the printing roll 26 comprises an elastomer layer, especially silicone rubber layer, formed on an outer circumference surface thereof. Further, the elastomer has shore hardness ranging from 20 to 70 HS.

In the apparatus constructed as described above, the ink injection roll 22 immersed into the ink 2 contained in the ink reservoir 21 rotates while in close contact with the forming roll 23, thus pushing ink into the forming grooves 23a provided on the surface of the forming roll. The lower part of the forming roll 23 is partially dipped into the ink and rotates so that ink having a low viscosity sufficiently fills the forming grooves 23a. The forming roll 23 laden with the ink is scraped by the doctor blade 24 to remove the ink from the surface of the forming roll 23. Thereafter, the surface of the ink remaining only in the forming grooves 23a is hardened to some extent by hot air or light from the first drying device 25 for the instantaneous drying operation, thus having high cohesion and so being transferable to the surface of the printing roll 26.

The ink transferred to the printing roll 26 is turned over in the direction opposite the ink in the forming grooves 23a, so that the surface of the ink existing in the forming grooves is hardened to some extent and can then be attached to the printing roll. The ink present in the forming grooves is exposed to the atmosphere, and is instantaneously dried by the second drying device 27 so as to be hardened to some extent. All of the ink, hardened by the instantaneous drying operation performed twice, is pressurized by the press roll 28 to be printed on the printing paper 1. At this time, the ink hardened by the instantaneous drying operation can maintain the shape of the ink layer, even if impression pressure is applied to the ink.

In a detailed description, when the forming roll 23 enters the ink reservoir 21, the ink is compactly charged in the forming grooves by the ink injection roll 22. Ink covering places other than the forming grooves 23a is removed by the doctor blade 24. When the forming groove filled with the ink is positioned in front of the first drying device 25, the solvent is rapidly volatilized at the surface of the ink, so that the surface of the ink is hardened to some extent. Thereafter, the primary transfer pressure acts on the hardened ink at the position where the ink contacts the printing roll 26. However, the hardened surface of the ink serves as a cover, thus preventing the ink from leaking out from the forming grooves even though nip pressure is momentarily increased.

The surface (i.e., elastomer layer) of the printing roll 26, which is low in hardness and high in elasticity, serves to absorb the nip pressure, thus aiding in the stability of the ink in the forming grooves 23a. In order to smoothly transfer the ink to the printing roll 26, the surface is dried at a position around the first drying device 25 so that the ink does not adhere excessively strongly to the edge of each forming groove 23a. Further, the ink is dried to a proper level so that the ink surface, having affinity to the surface of the printing roll 26, maintains its adhesive force. The ink is turned over during the transfer to the printing roll 26. Even ink present inside each forming groove 23a is dried to some extent by the second drying device 27, so that the ink has viscoelasticity, unlike the ink stored in the ink reservoir 21. As a result, the pattern shape does not collapsed despite high nip pressure between the printing roll 26 and the press roll 28 when printing is conducted. Further, the durability of the ink is ensured, so that its state when printed on the printing paper 1 is good.

That is, the ink is highly diluted in solvent at first. The solvent of the ink is volatilized to a predetermined level using the drying devices in stages during the transferring process, thus increasing the cohesion of the ink and imparting the ink with durability against the nip pressure. Further, the deformation of the ink layer of the printing paper 1, completely separated from the silicone rubber having excellent separation capacity, is minimized, the line width is maintained without a change, and the ink layer is not broken due to the shape and durability thereof which are already provided on the printing roll 26. The leveling of the surface of the fine line and the roughness of the edge is already realized on the printing roll, so that a good result is achieved. This invention has hardening effect allowing inversion like a frying pan.

On the other hand, the electronic device manufacturing apparatus according to the present invention may further comprise a plurality of drying units 80 provided on printing paper-paths out of the printing units 20 or/and on printing paper-paths out of the coating units 30 to dry or cure printed ink completely.

As shown in FIG. 2, preferably, each drying unit 80 is provided on a printing paper-path between the press roll 28 of the printing unit 20 and the guide roll 60 installed out of the printing unit 20. Also, the drying unit 80 may be provided on a printing paper-path between the coating unit 30 and the guide roll 60 installed out of the coating unit 30.

Functional Ink transferred from the printing roll 26 to the printing paper 1 and coating agent supplied on the printing paper 1, which is discharged from the printing unit 20 and the coating unit 30, is dried or cured sufficiently by the drying units 80.

The ink transfer pressure (contact pressure) between the forming roll 23 and the printing roll 26, and the impression pressure between the printing roll 26 and the press roll 28 are individually controlled to proper pressures by a pressure control system so that the ink layer having a fine line width is transferred to the printing paper 1 as faithfully as possible. The ink transfer pressure between the forming roll 23 and the printing roll 26 and the impression pressure between the printing roll 26 and the press roll 28, which presses the printing paper 1, must be controlled by the precision pressure control system to maintain a required ink shape as precisely as possible, thus allowing the micro pattern for the IC chip to be manufactured on a printer using a roll-to-roll process.

In order to achieve the object, the apparatus according to the present invention further comprises a first pressure regulator 29a installed to regulate contact pressure between the forming roll 23 and the printing roll 26 and a second pressure regulator 29b installed to regulate contact pressure between the printing roll 26 and the press roll 28. In this case, a servo motor may be utilized as the pressure regulators 29a and 29b. The servo motor always maintains constant pressure using a pressure control means (not shown).

Hereinafter, functions of the first pressure regulator 29a and 29b provided for controlling a pressure between the printing roll 26 and the forming roll 23 and the second pressure regulators 29b provided for controlling a pressure between the printing roll 26 and the press roll 23 are illustrated in more detail.

In the offset mechanism in which a pattern formed on the forming roll 23 made of metal material is transferred to a surface of the printing roll 26 covered with an elastomer layer having a relative low hardness, a cylinder packing technique known from a conventional lithographic offset printing method is required.

If an appropriate "cylinder packing technique" is not applied to the printing roll 26, the pattern image can not be transformed accurately and a slur can be generated when the pattern is transformed, whereby the printing quality becomes degraded. The above problem is caused by a slip phenomenon. That is, the elastomer layer on both end portions of the printing roll is expanded by a nip pressure (contact pressure) between the printing roll and the forming roll to form bulge on the printing roll so that a rotational circumference of the printing roll is increased by the bulges. Due to an increase of rotational circumference of the printing roll, the slip between two rolls is generated.

In the conventional offset printing method, in order to solve the above problem, bearers are provided at both ends of a plate cylinder and a blanket cylinder to allow the same circumferences of both cylinders to be maintained, or a thickness packing plate placed below a printing plate and a blanket is controlled to regulate a printing pressure. In recent, in addition, a compressible blanket in which a bubble layer is formed has been developed to minimize a generation of slip effect.

Due to a difference of printing manners, the cylinder packing technique utilized in the lithographic offset printing method can not be applied to the gravure offset printing unit according to the present invention. In particular, an upgraded technique for preventing a slip phenomenon should be so secured for the present invention in which a plurality of gravure offset printing units are arranged in line in single apparatus in which circuit patterns are precisely printed to manufacture the IC chip.

Gravure offset printing method has been applied occasionally to a rotary pad printing apparatus or another printing apparatus. However, the gravure offset printing method is performed only by single printing unit free from above slip effect. Basically, the cylinder packing technique has not been developed for the in-line overlapping gravure offset printing device being capable of printing a pattern with high quality.

In the present invention, a precision pressure control system can be employed to prevent a slip effect from being generated between two rolls (between the forming roll 23 and the printing roll 26 and between the printing roll 26 and the press roll 28) made of different materials when one roll pressurizes the other one.

Below, an operation of the first pressure regulator 29a for regulating a contact pressure between the printing roll 26 and the forming roll 23 mounted in one printing unit 20 is illustrated as one example, with reference to FIGS. 4a, 4b and 4c.

The forming roll 23 is mounted in the printing unit 20 of the apparatus shown in FIG. 2. At first trial, the press roll 28 and the forming roll 23 are separated from the printing roll 26, the printing roll 26 is not coupled to any driving means so that the printing roll can be freely rotated. And, the printing roll 26 covered with an elastomer layer and having a diameter slightly less than that of the forming roll 23 is mounted in the printing unit 20.

Then, the forming roll 23 becomes in contact with the printing roll 26 with a set value of pressure. And the printing roll 26 is driven by the forming roll 23 which is driven in low speed by a driving system. In this state, the forming roll 23 and the printing roll 26 make two revolutions by a driving of the forming roll 23, and the ink is transferred from forming roll 23 to the printing roll 26 to form an ink pattern on a surface of the printing roll 26. Thereafter, the operator user checks whether the ink pattern is accurately overlapped with the ink pattern formed previously on the printing roll 26.

At this time, if the set pressure between the forming roll 23 and the printing roll 26 is excessive, the elastomer layer of the printing roll 26 is pressed and expanded by a nip pressure (contact pressure) to form bulge ("c" in FIG. 4a) on the printing roll 26. As a result, the ink pattern is not accurately overlapped with the ink pattern formed previously on the printing roll 26 as shown in a left part of FIG. 4c, To correct the above inconsistence between two ink patterns, the operator operates the servo motor 29a to allow the forming roll 13 to be moved with respect to the printing roll 26, that is, to retreat the forming roll 23 and reduce the first set contact pressure. Accordingly, the two patterns formed on the surface of the printing roll 26 are adjusted, and so the circumference of the printing roll 26 covered with an elastomer layer is adjusted with the circumference of the forming roll 23. As a result, when the forming roll 23 and the printing roll 26 are rotated, the ink pattern is accurately overlapped with the ink pattern formed previously on the printing roll 26 as shown in a right part of FIG. 4c.

The last pressure value set by the above process is a pressure value of the forming roll 23 to be set when a printing process is performed in the printing unit 20. If the operator determined last pressure value was low compared with a desirable printing quality, then the diameter of the printing roll 26 covered with an elastomer layer could be reduced further. A desirable pressure set value is determined by the above trial and error method. During the printing process, regardless of a partial variation of thickness of the web paper 1 to be printed, the set pressure value may be maintained constantly.

It will be apparent, on the other hand, the function of the second pressure regulator 29b coupled to the pressure roll 28 is determined by printing quality.

As compared with the lithographic offset method in which diameters of two cylinders are adjusted by means of the packing sheets, the gravure offset apparatus of the present invention is characterized in that the forming roll 23 and the printing roll 26 have the same circumferences by mounting the above precision pressure regulators 29a and 29b to prevent the slip phenomenon from being generated.

Due to the gravure offset unit according to the present invention, it is possible perform a precise rotary printing process and the in-line type printing apparatus consisting of a plurality of gravure offset units may be achieved.

As such, a constant impression pressure is always maintained by constant contact pressure between the rolls, which is automatically controlled, thus allowing uniform printing at a predetermined thickness to be achieved. Even if the gap of the forming roll 23 or the printing roll 26 becomes narrower or wider due to failure during the operation, constant transfer pressure is maintained, so that the printing quality is almost constant. In this case, the printing roll 26 whose surface is made of elastomer primarily absorbs shocks.

Meanwhile, the respective rolls adopt a direct power transmission method using a synchronous control operation of a servomotor without a power transmission component. Thus, compared to the case having mechanical power transmission components (e.g. gears), the mechanical factors hindering precision, such as backlash or inertia error, are minimized. Further, it is not necessary to precisely manufacture the mechanical components at high cost. Thus, this invention is advantageous in terms of cost.

As described above, the present invention develops a new ink transfer method which is important in a printing unit, thus allowing a micro electronic circuit pattern having a micro line width of an IC chip, such as a thin film transistor, to be produced through a roll-to-roll lamination printing method. The invention improves the printing to have resolution of about 10 μm, which is difficult in general rotary pressing, thus permitting the use of the latest rotary press driving system, therefore being capable of economically producing a kilo-grade printed IC chip having a general function. Thereby, an industrial base for economically providing a vast number of RFID/USN electronic products required in a ubiquitous information age is realized.

Further, the present invention provides a printing method which is capable of promoting the research and development of materials required to manufacture an IC chip, such as conductive ink, semiconductor ink, or dielectric ink, and the new design of various kinds of IC chips or electronic parts made of the above-mentioned materials, thus providing proper production equipment for an MEMS using the printing method. The ink transfer method of the invention hardens a fine electronic circuit pattern having a micro line width during the ink transfer process, so that the printing is achieved on the printing paper without change to a shape even if impression pressure is applied. Thus, the invention realizes stable ink transfer especially in the case where an existing printing line is printed to overlap a print line having a different function.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. An apparatus for manufacturing electronic devices using a roll-to-roll rotary pressing process, comprising:
   a winding roll around which flexible printing paper is wound;
   a plurality of printing units arranged in a straight line;
   at least one coating unit, comprising:
      a coating-agent container to contain a coating agent therein;
      a coating-agent feeding roll installed to be immersed in the coating agent;
      a coating roll installed to contact the coating-agent feeding roll, rotating in one direction, and coating a surface of the printing paper having a circuit pattern with the coating agent;
      a coating press roll installed to contact the coating roll, thus pressing the printing paper;
   a rewinding roll to rewind the printing paper when printing has been completed;

a plurality of guide rolls arranged between the winding roll and the rewinding roll, thus guiding the printing paper; and tension regulating units installed around the winding roll and the rewinding roll, respectively, for regulating tension of the printing paper;

wherein each of the plurality of printing units comprises:
an ink reservoir storing functional ink therein;
an ink injection roll installed to be immersed in the functional ink;
a forming roll installed to be rotated in one direction while contacting the ink injection roll, with forming grooves provided on a surface of the forming roll to correspond to a shape of a desired circuit pattern;
a doctor blade installed to contact a side of the forming roll, and scraping ink from the surface of the forming roll;
a first drying device adjacent to the forming roll and the doctor blade, the first drying device configured to partially dry a surface of the functional ink injected into each of the forming grooves of the forming roll after scraping the functional ink;
a printing roll installed to be rotated in a direction opposite that of the forming roll while contacting the forming roll, and transferring forming ink transferred from the forming roll to the printing paper;
a second drying device adjacent to the printing roll at an opposite side of the first drying device with respect to a contact point of the forming roll and the printing roll, the second drying device configured to partially dry another surface of the forming ink transferred to a surface of the printing roll after transferring the forming ink; and
a press roll installed to be rotated in a direction opposite that of the printing roll while contacting the printing roll, and pressing the printing paper toward the printing roll at a constant pressure; and
wherein the first drying device is at least one of a hot air supply unit or a hardening unit using IR, and the second drying device is at least one of a hot air supply unit or a hardening unit using IR.

2. The manufacturing apparatus as set forth in claim 1, wherein the printing roll comprises an elastomer layer formed on an outer circumference thereof.

3. The manufacturing apparatus as set forth in claim 2, wherein the elastomer layer has shore hardness ranging from 20 to 70 HS.

4. The manufacturing apparatus as set forth in claim 1, wherein each printing unit further comprises a first pressure regulator coupled to the forming roll to allow the forming roll to be moved with respect to the printing roll for regulating contact pressure between the forming roll and the printing roll.

5. The manufacturing apparatus as set forth in claim 1, each printing unit further comprises a second pressure regulator coupled to the press roll to allow the press roll to be moved with respect to the printing roll for regulating contact pressure between the press roll and the printing roll.

6. The manufacturing apparatus as set forth in claim 1, further comprising a cutting unit installed before the rewinding roll, thus cutting the printing paper when a printing process is completed.

7. An apparatus for printing electronic devices, comprising:
an ink reservoir storing functional ink therein;
an ink injection roll installed to be immersed in the functional ink;
a forming roll installed to be rotated in one direction while contacting the ink injection roll, with forming grooves provided on a surface of the forming roll to correspond to a shape of a desired circuit pattern;
a doctor blade installed to contact a side of the forming roll, and scraping ink from a surface of the forming roll;
a first drying device adjacent to the forming roll and the doctor blade, the first drying device configured to partially dry a surface of the functional ink injected into each of the forming grooves of the forming roll after scraping the functional ink;
a printing roll installed to be rotated in a direction opposite that of the forming roll while contacting the forming roll, and transferring forming ink from the forming roll to a printing paper;
a second drying device adjacent to the printing roll at an opposite side of the first drying device with respect to a contact point of the forming roll and the printing roll, the second drying device configured to partially dry another surface of the forming ink transferred to a surface of the printing roll after transferring the forming ink;
a press roll installed to be rotated in a direction opposite that of the printing roll while contacting the printing roll, and pressing the printing paper toward the printing roll at a constant pressure;
a first pressure regulator using a servo motor coupled to the forming roll to allow the forming roll to be moved with respect to the printing roll for regulating contact pressure uniformly between the forming roll and the printing roll;
a second pressure regulator using a servo motor coupled to the press roll to allow the press roll to be moved with respect to the printing roll for regulating contact pressure uniformly between the press roll and the printing roll; and
wherein the first drying device is at least one of a hot air supply unit or a hardening unit using IR, and the second drying device is at least one of a hot air supply unit or a hardening unit using IR.

8. The printing apparatus as set forth in claim 7, wherein the printing roll comprises an elastomer layer formed on an outer circumference thereof.

9. The printing apparatus as set forth in claim 8, wherein the elastomer layer has shore hardness ranging from 20 to 70 HS.

* * * * *

UNITED STATES PATENT AND TRADEMARK OFFICE
CERTIFICATE OF CORRECTION

| | | |
|---|---|---|
| PATENT NO. | : 8,689,687 B2 | Page 1 of 1 |
| APPLICATION NO. | : 12/476104 | |
| DATED | : April 8, 2014 | |
| INVENTOR(S) | : Choi et al. | |

It is certified that error appears in the above-identified patent and that said Letters Patent is hereby corrected as shown below:

On the title page, item [30]:

Replace KR 20-2005-0030722 with KR 10-2005-0030722

Signed and Sealed this
Eleventh Day of November, 2014

Michelle K. Lee
*Deputy Director of the United States Patent and Trademark Office*